United States Patent
McAleenan et al.

(10) Patent No.: US 11,506,686 B2
(45) Date of Patent: Nov. 22, 2022

(54) HIGH DENSITY WAVEGUIDE ASSEMBLY FOR MILLIMETER AND 5G APPLICATIONS

(71) Applicant: Advantest Corporation, Tokyo (JP)

(72) Inventors: Roger McAleenan, San Jose, CA (US); YuChang Liu, San Jose, CA (US)

(73) Assignee: Advantest Corporation, Tokyo (JP)

( * ) Notice: Subject to any disclaimer, the term of this patent is extended or adjusted under 35 U.S.C. 154(b) by 187 days.

(21) Appl. No.: 16/918,881

(22) Filed: Jul. 1, 2020

(65) Prior Publication Data

US 2021/0156889 A1 May 27, 2021

Related U.S. Application Data

(60) Provisional application No. 62/940,088, filed on Nov. 25, 2019.

(51) Int. Cl.
| | |
|---|---|
| *G01R 1/24* | (2006.01) |
| *H01P 5/08* | (2006.01) |
| *G01R 1/44* | (2006.01) |
| *G01R 31/28* | (2006.01) |
| *H01P 3/12* | (2006.01) |

(52) U.S. Cl.
CPC ............ *G01R 1/24* (2013.01); *G01R 1/44* (2013.01); *G01R 31/2822* (2013.01); *G01R 31/2834* (2013.01); *H01P 3/12* (2013.01); *H01P 5/08* (2013.01)

(58) Field of Classification Search
CPC ... G01N 2291/0427; G01N 2291/0422; G01N 2291/0423; G01N 2291/0256; G01N 29/2462; G01N 29/30; G01N 15/1484; G01N 21/9081; G01N 27/44791; G01R 31/28; G01R 31/343; G01R 1/24; G01R 31/2822; G01R 31/2834; G01R 31/11; H01P 3/12; H01P 5/024; H01P 5/08; H01P 3/121; H01P 5/107; H01P 5/12; H04W 84/12

See application file for complete search history.

(56) References Cited

U.S. PATENT DOCUMENTS

| | | | | |
|---|---|---|---|---|
| 6,011,453 | A * | 1/2000 | Glinder | H01P 11/00 333/248 |
| 9,863,976 | B2 * | 1/2018 | Sarhad | G01R 31/69 |
| 10,114,067 | B2 * | 10/2018 | Lam | G01R 1/0441 |
| 10,371,716 | B2 * | 8/2019 | Lee | G01R 31/2834 |
| 10,381,707 | B2 * | 8/2019 | Lee | H01Q 21/065 |
| 10,530,047 | B2 * | 1/2020 | Pan | H01Q 9/0407 |
| 10,992,016 | B2 * | 4/2021 | Kamgaing | H01P 5/107 |
| 11,223,099 | B1 * | 1/2022 | Allen | H01P 1/047 |
| 2021/0408653 | A1 * | 12/2021 | Correas-Serrano | H01P 5/087 |

\* cited by examiner

*Primary Examiner* — Vinh P Nguyen

(57) ABSTRACT

Embodiments of the present disclosure use a customizable ganged waveguide that comprises a top metal plate and a bottom metal plate with trenches that come together in a way so as to form waveguide channels. The waveguide assembly of the present invention also comprises a waveguide adapter affixed to a first end of the ganged waveguide and operable to conduct the signal to a tester. Further, it comprises an air barrier affixed to a second end of the ganged waveguide to prevent air from flowing from the ganged waveguide to a printed circuit board connected at the second end. Finally, it comprises a tuning plate comprising double ridge slots configured to allow maximal signal to be transferred to the printed circuit board from the ganged waveguide.

18 Claims, 11 Drawing Sheets

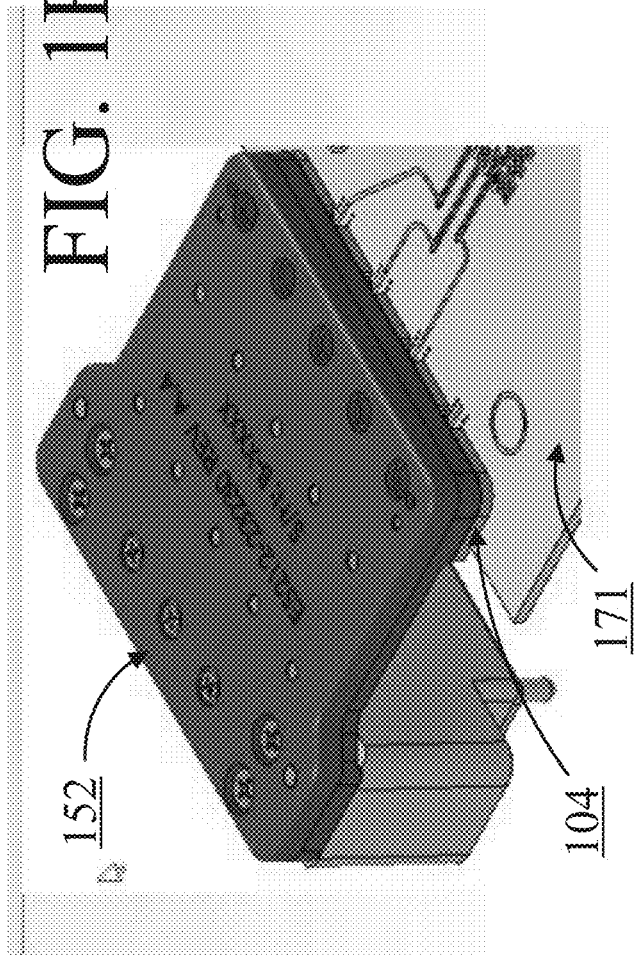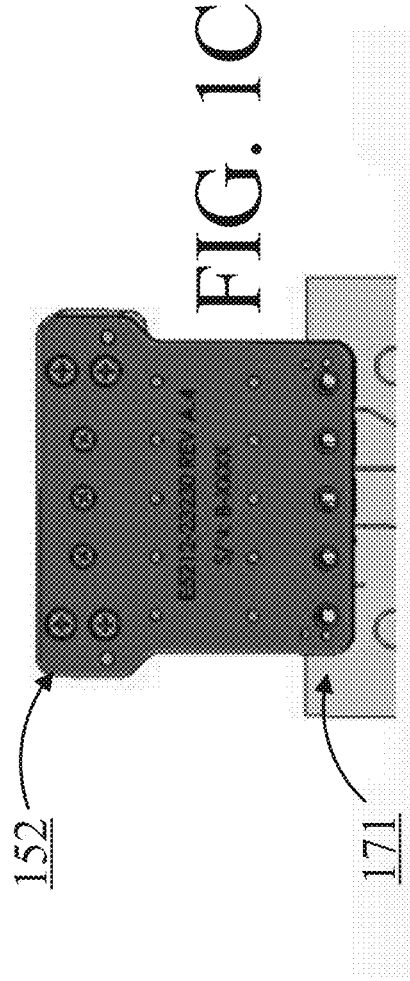

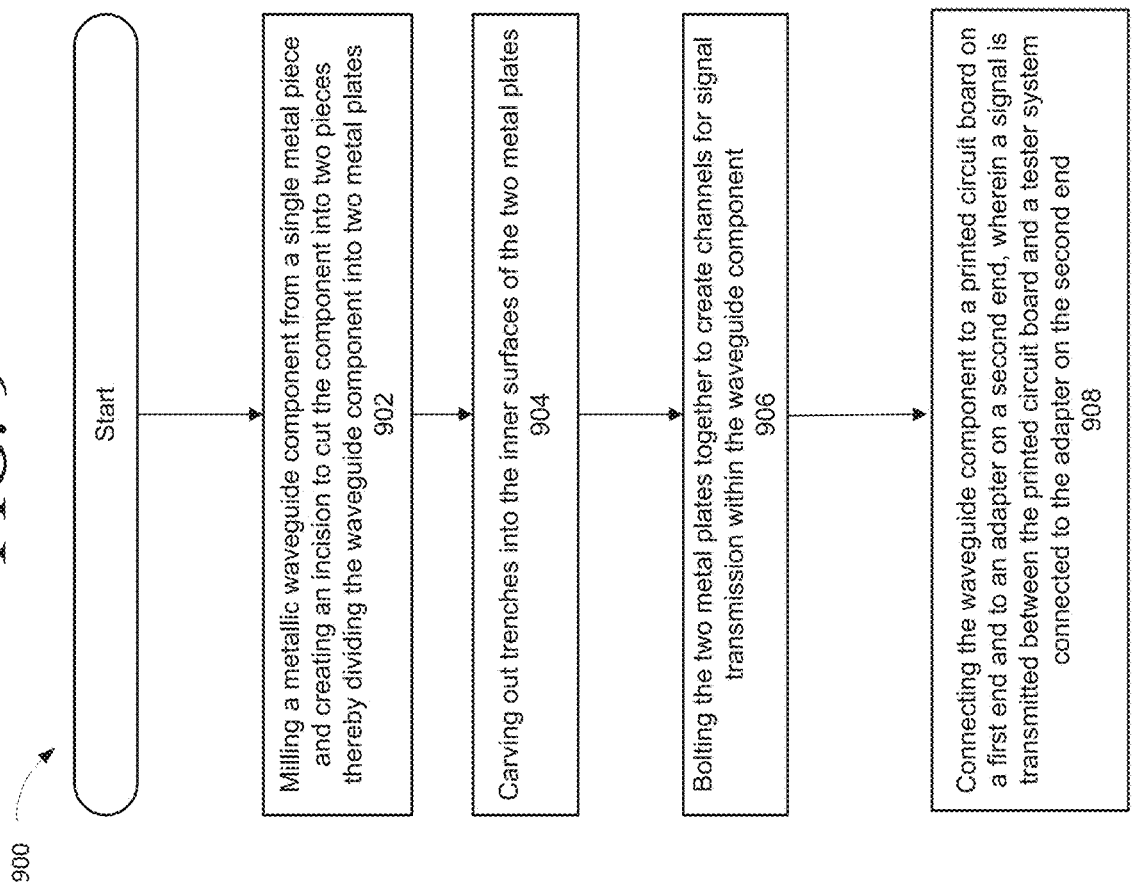

HIGH DENSITY WAVEGUIDE ASSEMBLY FOR MILLIMETER AND 5G APPLICATIONS

CROSS-REFERENCE TO RELATED APPLICATIONS

This application is a conversion of and claims priority to and the benefit of Provisional Patent Application No. 62/940,088, entitled "HIGH DENSITY WAVEGUIDE ASSEMBLY FOR MILLIMETER AND 5G APPLICATIONS," having a filing date of Nov. 25, 2019, which is herein incorporated by reference in its entirety.

This application is related to patent application Ser. No. 15/016,133, "MULTIPLE WAVEGUIDE STRUCTURE WITH SINGLE FLANGE FOR AUTOMATIC TEST EQUIPMENT FOR SEMICONDUCTOR TESTING," filed Feb. 4, 2016, now issued as U.S. Pat. No. 10,381,707, which is herein incorporated by reference in its entirety.

This application is also related to patent application Ser. No. 15/016,151, "INTEGRATED WAVEGUIDE STRUCTURE AND SOCKET STRUCTURE FOR MILLIMETER WAVEBAND TESTING," filed Feb. 4, 2016, now issued as U.S. Pat. No. 10,114,067, which is herein incorporated by reference in its entirety.

This application is also related to patent application Ser. No. 15/016,143, "PLATING METHODS FOR MODULE AND/OR GANGED WAVEGUIDES FOR AUTOMATIC TEST EQUIPMENT FOR SEMICONDUCTOR TESTING," filed on Feb. 4, 2016, now pending as U.S. Publication No. 2017,0229757, which is herein incorporated by reference in its entirety.

FIELD OF THE INVENTION

Embodiments of the present disclosure generally relate to Automatic Test Equipment (ATE) for testing electronic components.

BACKGROUND

Automatic Test Equipment (ATE) is commonly used within the field of electronic chip manufacturing for the purposes of testing electronic components. ATE systems both reduce the amount of time spent on testing devices to ensure that the device functions as designed and serve as a diagnostic tool to determine the presence of faulty components within a given device before it reaches the consumer.

ATE systems can perform a number of test functions on a device under test (DUT) through the use of test signals transmitted to and from the DUT. Conventional ATE systems are very complex electronic systems and generally include printed circuit boards (PCB), coax cables and waveguides to extend the signal path of test signals transmitted from the DUT to a tester diagnostic system during a test session. However, increases to the length of the signal path, particularly at millimeter frequencies, can result in the loss of signal strength which can degrade the integrity of test signals transmitted from the DUT at high frequencies.

Conventional ATE systems use PCBs that include several centimeters of microstrip transmission lines and patch antennae that are disposed on the surface of a PCB to convey test signals from a DUT to a tester diagnostic system. Furthermore, when waveguides are used in conventional ATE systems requiring high frequency signaling, and conventional waveguide flanges are used to mate the waveguide and tester electronics to the DUT, the general dimensions of these flanges, which are often circular in shape, can be a limiting factor to the total signal path of test signals and the placement pitch of the patch antennae. For example, conventional waveguide flanges may be too large and may not allow for a tightly pitched patch antennae matrix. Accordingly, the elongation of the test signal path caused by use of longer microstrip transmission lines as well as other components, such as coax cables and conventional waveguide flanges (including any adaptors required by these components) by modern ATE systems can result in unnecessary signal loss at high frequencies and decreased pitch of the patch antennae. Furthermore, the waveguide flanges, which tend to have larger diameters, reduce available space for load board and socket applications, especially for multi-site use cases.

Furthermore, the large size of the waveguide flanges means that they cannot be closely mounted together with adjacent waveguides when multiple signal paths need to converge on an integrated circuit with tightly aligned signal paths and patch antennae that have tight pitch spacing.

SUMMARY OF THE INVENTION

Accordingly, a need exists for an apparatus and/or method that can address the problems with the approaches described above. Using the beneficial aspects of the apparatus and/or method described, without their respective limitations, embodiments of the present disclosure provide a novel solution to address these problems.

Embodiments of the present disclosure provide a metal high density waveguide assembly that is constructed from a series of machined plates stacked up to create waveguide channels and orientation. The interface is typically metal and may be connected to various custom interfaces (e.g., daughter cards) where the waveguide signal may be launched onto the card via a millimeter probe. The motivating factors for the ganged waveguide design of the present invention comprise: a) manufacturability; and 2) operation within high temperature environments (e.g., 150 degrees C.).

Embodiments of the present disclosure use a customizable ganged waveguide that comprises a top metal plate and a bottom metal plate with trenches that come together when the top metal plate is affixed to the bottom metal plate in a way to form waveguide channels. The waveguide assembly of the present invention also comprises a transition adapter affixed to a first end of the ganged waveguide and operable to conduct the signal to a tester system. In one or more embodiments, the waveguide adapter is constructed using plastic materials. Further, the waveguide assembly comprises an air barrier affixed to a second end of the ganged waveguide to prevent air from flowing from a printed circuit board connected at the second end to the ganged waveguide. Finally, it comprises a tuning plate comprising double ridge slots configured to allow maximal signal to be transferred to the printed circuit board from the ganged waveguide.

In one embodiment, an integrated structure for signal transmission is disclosed. The integrated structure comprises a ganged waveguide operable to transmit a signal comprising a top metal plate and a bottom metal plate, wherein the top metal plate and the bottom metal plate comprise recesses, wherein the top metal plate and the bottom metal plate are affixed together to create waveguide channels. The integrated structure further comprises a waveguide adapter affixed to a first end of the ganged waveguide and operable to conduct the signal to a tester, wherein the waveguide adapter is operable to thermally isolate the ganged waveguide.

In another embodiment, a tester system is disclosed. The tester system comprises a ganged waveguide comprising a top metal plate and a bottom metal plate, wherein the top metal plate and the bottom metal plate comprise recesses, wherein the top metal plate and the bottom metal plate are affixed together to create waveguide channels. The tester system further comprises a waveguide adapter affixed to a first end of the ganged waveguide and operable to conduct a test signal to a tester, wherein the waveguide adapter is operable to thermally isolate the ganged waveguide. Additionally, the tester system comprises testing circuitry operable to generate the test signal and communicatively coupled to the waveguide adapter. Further, the tester system comprises a printed circuit board communicatively coupled to a second end of the ganged waveguide and a device under test (DUT) disposed on the printed circuit board, wherein the DUT is operable to receive the test signal from the testing circuitry.

A method of composing a ganged waveguide structure comprises creating an incision to cut a waveguide component into two metal plates. The method further comprises carving out trenches into respective inner surfaces of the two metal plates. Also, the method comprises bolting the two metal plates together to create channels for signal transmission within the waveguide component. Finally, the method comprises communicatively coupling a first end of the waveguide component to a printed circuit board and communicatively coupling a second end of the waveguide component to an insulative adapter, wherein a signal is transmitted between a DUT disposed on the printed circuit board and a tester system, wherein the tester system is communicatively coupled to the insulative adapter on the second end.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 1B is a perspective view of an exemplary ganged waveguide assembly in accordance with embodiments of the present disclosure.

FIG. 1C is a perspective top-view of an exemplary ganged waveguide assembly in accordance with embodiments of the present disclosure.

FIG. 9 is a flowchart of an exemplary method of composing a ganged waveguide structure in accordance with embodiments of the present disclosure.

DETAILED DESCRIPTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Embodiments of the present disclosure provide a metal high density waveguide assembly that is constructed from a series of machined plates stacked up to create waveguide channels and orientation. The interface is typically metal and may be connected to various custom interfaces (e.g., printed circuit boards, daughter cards) where the waveguide signal may be launched onto the card via a millimeter probe.

Figure 1A:
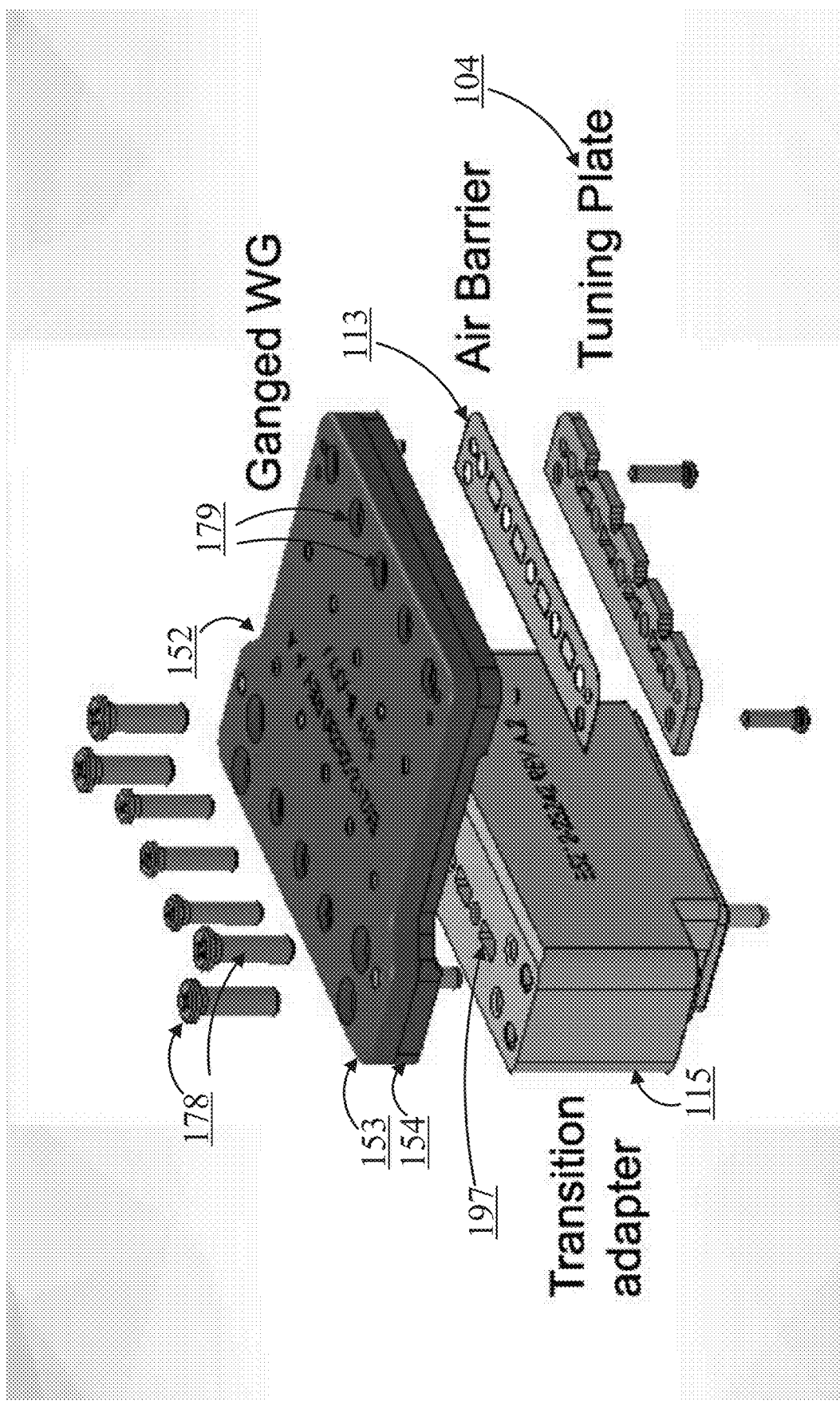
FIG. 1A is a perspective view of an exemplary ganged waveguide assembly in accordance with embodiments of the present disclosure.

FIG. 1A is a perspective view of an exemplary ganged waveguide assembly in accordance with embodiments of the present disclosure. The ganged waveguide assembly comprises the ganged waveguide component 152, an air barrier 113, a tuning plate 104, and a transition adapter 115.

While a single waveguide provides one channel for signal transmission, a ganged waveguide structure or component (e.g., ganged waveguide 152) comprises multiple waveguide channels inside that all share a common mounting structure. The ganged waveguide structure allows for a tighter pitch in the patch antennae matrix on a printed circuit board to which the ganged waveguide connects.

The ganged waveguide component 152 comprises two metal plates 153 and 154 sandwiched together. The two metal plates can be created using a machining process. The top metal plate 153 has some detail and the bottom metal plate 154 has some relief, where together the top metal plate and the bottom metal plate create the waveguide channels used for signal communication. The machining process used to create the ganged waveguide carves out the trenches in both the plates that create the corresponding channels, e.g., U-shaped, Z-shaped, L-shaped channels. In an embodiment, both plates may have trenches carved in them during the machining process because the two plates need to be sufficiently close in thickness for them to bolt together securely without resulting in a waveguide structure that is too rigid or unstable. In a different embodiment, trenches may be carved in only one of the two plates 153 and 154. In an embodiment, the two metal plates are then bolted together to create the ganged waveguide structure 152.

In one embodiment, brass, aluminum, or copper may be used to create the metal plates for the ganged waveguide. In an embodiment, both plates are machined out of the same metal piece. The piece is then cut and the trenches are defined in both plates. Thereafter, the plates are bolted back together to form the ganged waveguide structure.

In order for the ganged waveguide to operate at high temperatures, a temperature isolation transition adapter (or custom waveguide adapter) 115 is employed and an air barrier 113 is required and both are located at either ends of the final ganged waveguide component structure (as shown in FIG. 1A). These elements help to reduce the transfer of heat (which builds up in the metal waveguide structures) to the tester. This thermal isolation is particularly important for high temperature environments, e.g., for automobile applications that require a high temperature range of operation. For example, the tester system (which processes the signals from the device under test (DUT) being tested) that the ganged waveguide 152 connects to cannot withstand the high temperatures associated with the metal components of the waveguide 152. Accordingly, in one embodiment, the transition adapter 115 is used to create separation between the tester system and the ganged waveguide 152.

In one embodiment, the transition adapter 115 is manufactured using a machining process. For example, the transition adapter 115 may be machined if it is linear and does not comprise curves and ends. The transition adapter 115 needs to be flat so that the ganged waveguide 152 is affixed to the transition adapter in a way that does not dispense any radiation. In one embodiment, the transition adapter 115 is constructed using plastic. In an embodiment, however, the transition adapter comprises apertures 197. The apertures channel the signal into inner gold-plated channels (e.g., channel 409 in FIG. 4) within the transition adapter in order to communicate the signal between a DUT and a tester system (as will be discussed later). In a different embodiment, the inner portions of the transition adapter 115 can be coated with different metals other than gold.

In an embodiment, the ganged waveguide 152 comprises holes or apertures 179 for purposes of using fastening agents (e.g., screws 178) to couple the ganged waveguide 152 to a side of a printed circuit board (PCB) (e.g., a daughter card) or to the transition adapter 115.

In one embodiment, the air barrier element 113 is a transparent window that helps block or prevent the hot air flowing through the waveguide assembly (and, in particular, to prevent hot air from flowing into the waveguide assembly from a connected PCB). In an embodiment, the tuning plate 104 comprises double ridge slots that tune the signal so that most of the energy from the signal gets transmitted to the patch antennas on the daughter card. The air barrier element 113 and the tuning plate 104 will be discussed in further detail in connection with FIG. 5.

Figure 6:
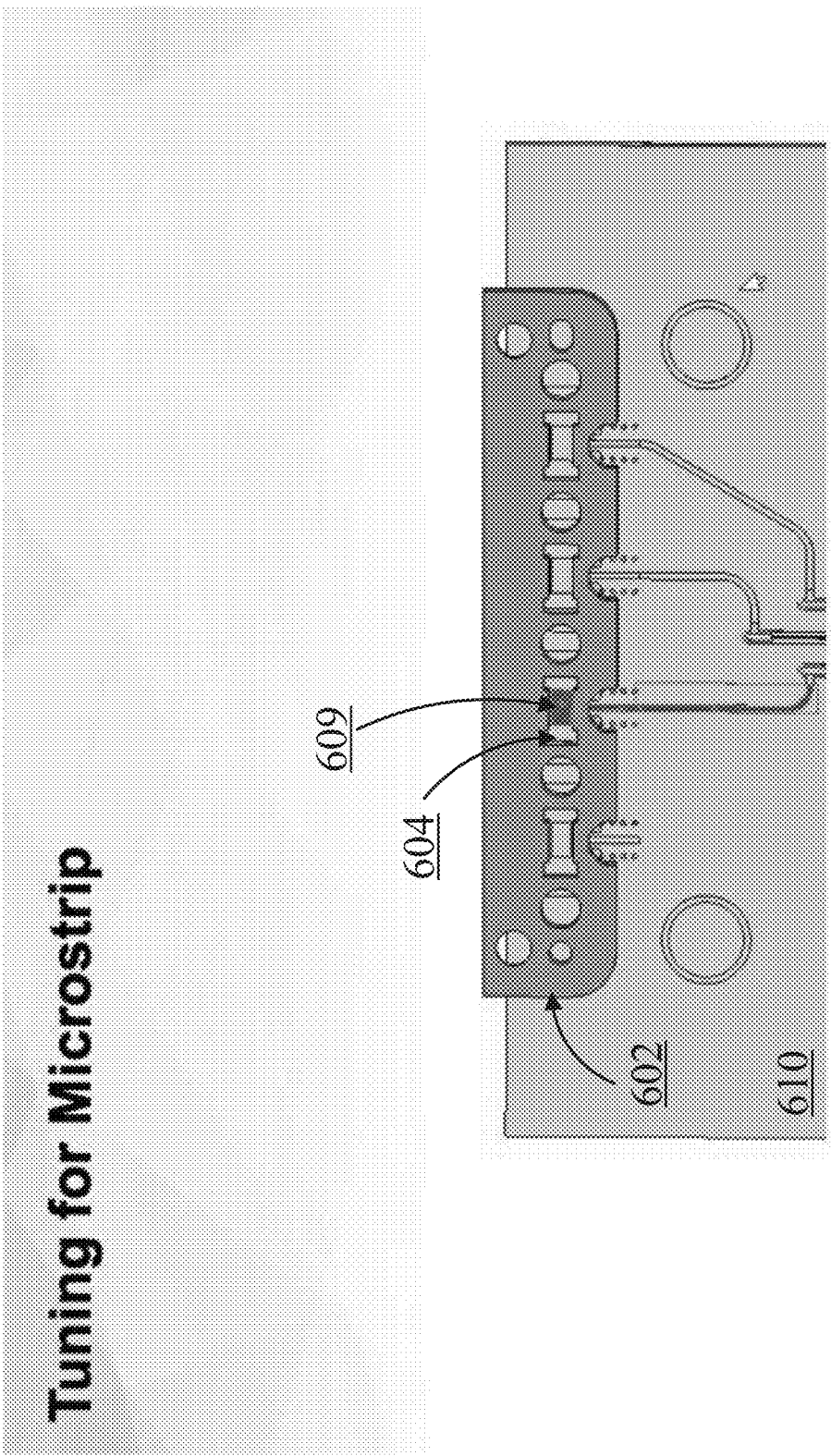
FIG. 6 is an exemplary perspective view of the tuning plate in connection with a printed circuit board (PCB) in accordance with embodiments of the present disclosure.

FIG. 1B is a perspective view of an exemplary ganged waveguide assembly in accordance with embodiments of the present disclosure. As shown in FIG. 1B, the ganged waveguide 152 is secured to a daughter card 171, which comprises transmission lines disposed on its surface to convey signals between a DUT (disposed on the daughter card 171) and a tester system (connected to the ganged waveguide 152 using the transition adapter 115 from FIG. 1A). As shown in FIG. 1B, fastening agents (e.g., screws 178 shown in FIG. 1A) are used to couple the ganged waveguide 152 to a side of the daughter card 171. Tuning plate 104 is sandwiched between the daughter card 171 and the ganged waveguide 152. In an embodiment, air barrier element 113 (shown in FIG. 1A) is also sandwiched between the daughter card 171 and the ganged waveguide 152. In an embodiment, daughter card 171 comprises patch antennae at the end of each signal trace shown and the patch antennae are under the waveguides of the ganged waveguide component 152 (as shown in FIG. 6).

As shown in FIGS. 1A and 1B, the metal high density ganged waveguide 152 is made up of a series of machined plates stacked up to create the waveguide channels and orientation. The interface is metal and can be connected to various custom interfaces such as "daughter cards" where the waveguide signal is launched onto this card via a millimeter probe.

FIG. 1C is a perspective top-view of an exemplary ganged waveguide assembly in accordance with embodiments of the present disclosure. FIG. 1C shows a top-down view of the ganged waveguide 152 fastened to the daughter card 171.

Figure 2:
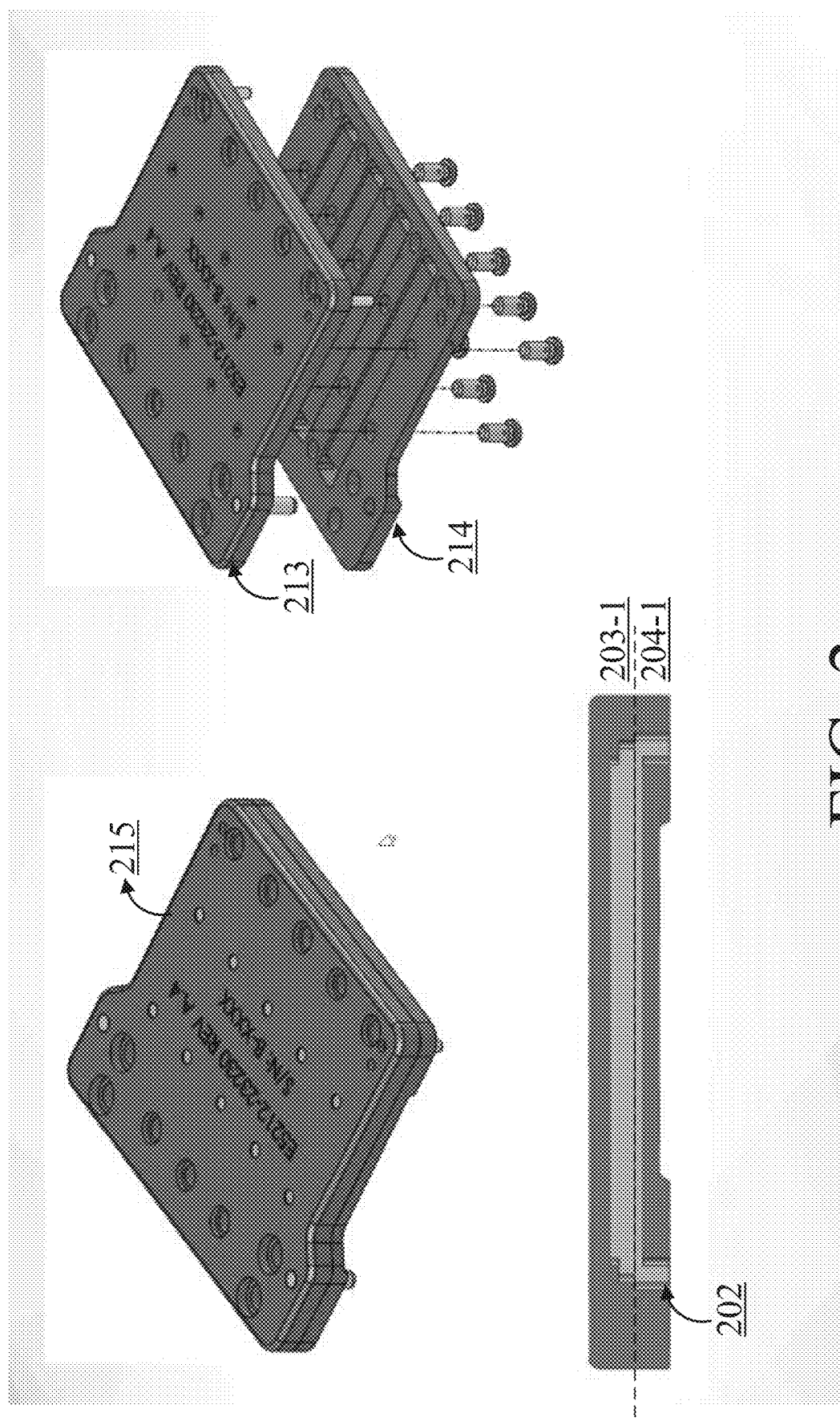
FIG. 2 is a perspective view of an exemplary U-shaped ganged waveguide in accordance with embodiments of the present disclosure.

FIG. 2 is a perspective view of an exemplary U-shaped ganged waveguide in accordance with embodiments of the present disclosure. In one embodiment, the ganged waveguide 215 is a U-shaped ganged waveguide shown in cross-section. The two metal plates 213 (the top plate) and 214 (the bottom plate) are sandwiched together so U-shaped waveguide channels (e.g., waveguide channel 202) are created. The U-Shaped design is used when the waveguides are mating with circuits that are both located on the same side of the plates. As seen in FIG. 2, the top part of the U-shaped cannel 203-1 in the cross-section of the waveguide channel is created as a result of the trenches or recesses in the top plate 213 and the bottom part 204-1 is created as a result of the recesses in the bottom plate 214.

Figure 3A:
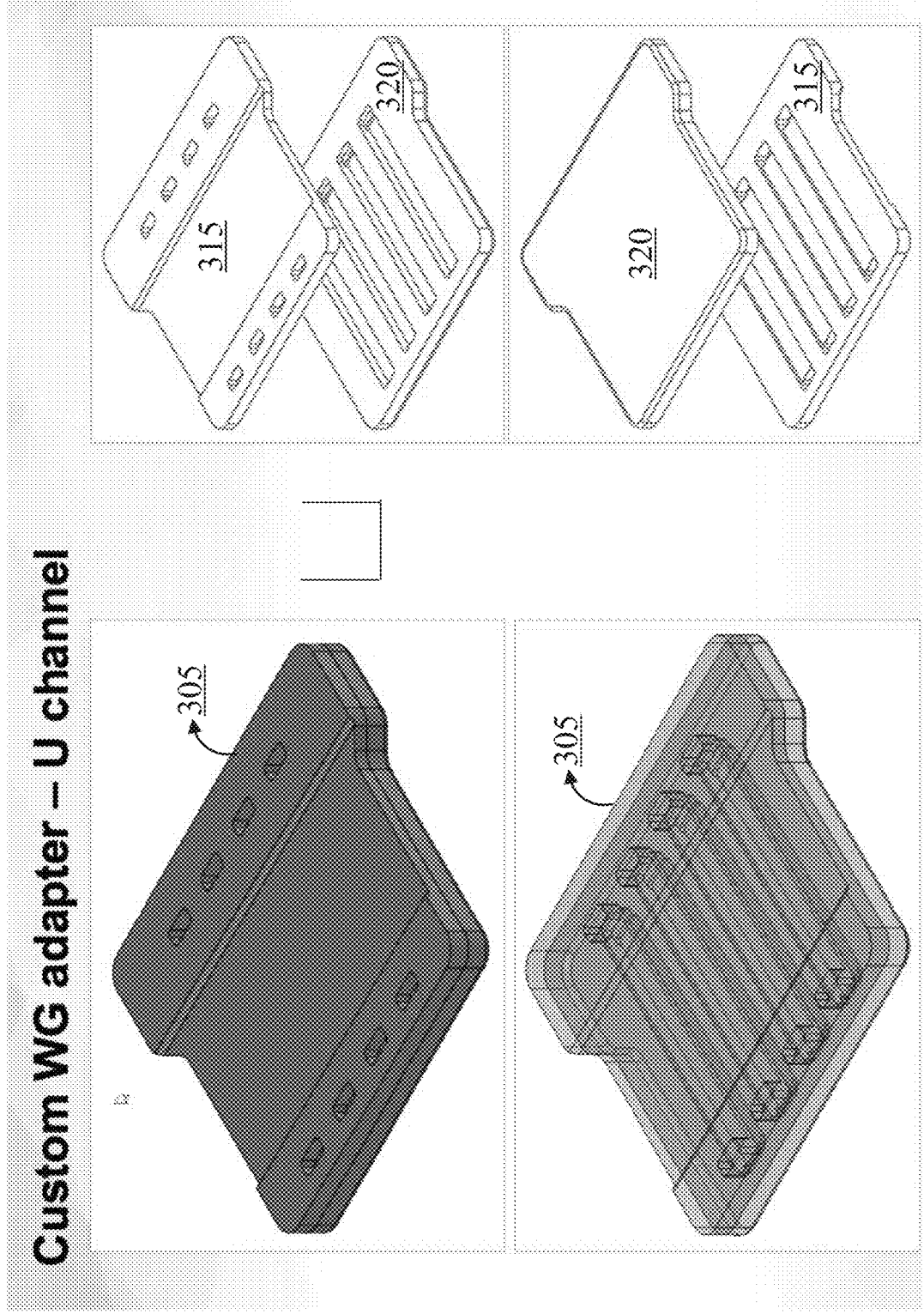
FIG. 3A is yet another perspective view of an exemplary U-shaped ganged waveguide in accordance with embodiments of the present disclosure.

FIG. 3A is yet another perspective view of an exemplary U-shaped ganged waveguide 305 in accordance with embodiments of the present disclosure. As seen in FIG. 3A, both the metal plates 315 and 320 may be approximately 2 mm in thickness. When the two metal plates 315 and 320 are stacked on top of each other, U-shaped waveguide channels are formed, through which the signals can be communicated. As shown in FIG. 3A, both the top plate 315 and the bottom plate 320 have trenches (or recesses) carved into them through the machining process that come together to form the waveguide channels. The signal mating for the U-shaped waveguide are both on the same side of the waveguide components, e.g., side 315.

Figure 3B:
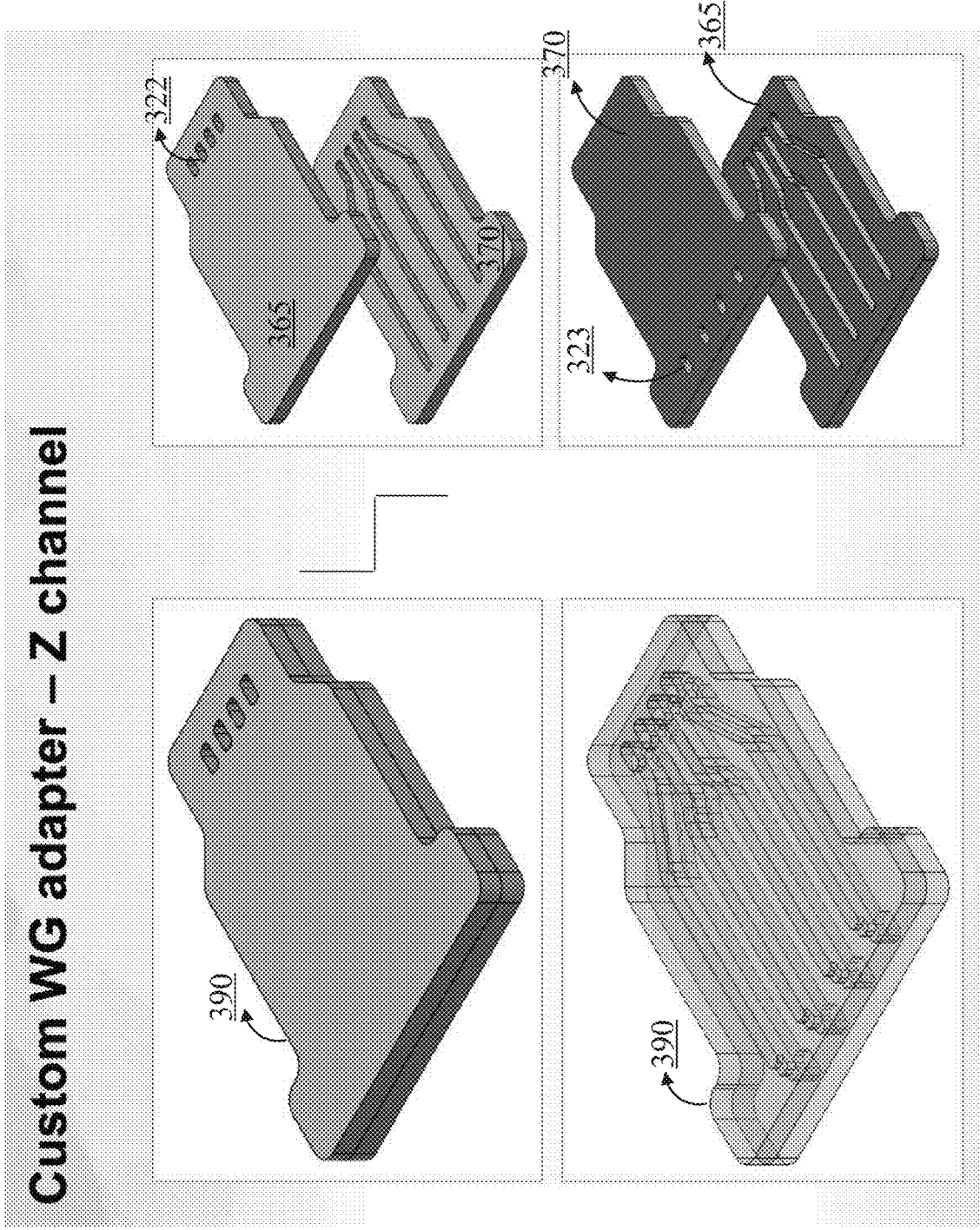
FIG. 3B is yet another perspective view of an exemplary Z-shaped ganged waveguide in accordance with embodiments of the present disclosure.

FIG. 3B is a perspective view of an exemplary Z-shaped ganged waveguide 390 in accordance with embodiments of the present disclosure. The Z-Shaped design is used when the waveguides are mating with circuits that are located on different sides of the plates 365 and 370 (one over, one under). For example, a signal may be inputted into the Z-shaped ganged waveguide 390 through aperture 322 on plate 365 and may output the waveguide assembly through aperture 323 on the underside of plate 370.

The machining process for the Z-shaped plates is different from the machining process for the U-shaped plates. Both the U-Shaped and the Z-Shaped ganged waveguides can operate without concern to temperature. Moreover, the ganged waveguides are made with channel dimensions which operate with a flat response over a wide range of frequencies. In order to optimize the structure for a particular frequency, a tuning plate (e.g. tuning plate 104 in FIG. 1A) is utilized at the daughter board side.

Figure 4:
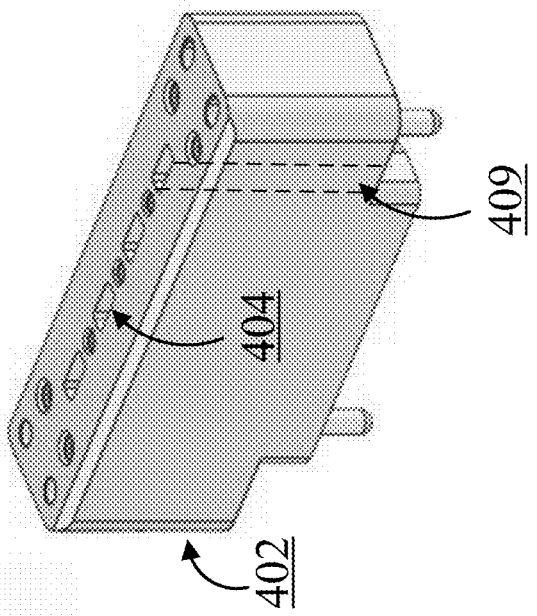
FIG. 4 is an exemplary perspective view of a custom waveguide adapter in accordance with embodiments of the present disclosure.

FIG. 4 is an exemplary perspective view of a custom waveguide adapter in accordance with embodiments of the present disclosure. The custom waveguide adapter (or transition adapter) is a component that is needed for performing temperate isolation. The custom waveguide adapter 402 is typically a plastic piece. Because the metal waveguide can experience temperatures upwards of 150 C, a plastic piece that does not conduct heat efficiently, is needed to connect the ganged waveguide component with the rest of the electronics. As seen in FIG. 4, the adapter 402 has openings or apertures 404 for the waveguide signals to propagate through the adapter. As noted above, in an embodiment, the channels 409 within the custom waveguide adapter 402 may be gold-plated for effective conduction.

The metal implementation of the waveguide and the combination with plastic components, e.g., 402 provide many improved features and benefits. The all-metal waveguide component has significant electric advantages, e.g., improved return loss, lower insertion loss, structural robustness, and 2D orientation flexibility, e.g., U shape, S shape, L shape.

The metal waveguide combined with the plastic adapter allows operation over wide temperature ranges. The metal provides a solid mounting and low loss while the plastic interface provides the thermal isolation. This keeps DUT test temperatures away from the test equipment/internal test set modules/ATE test head components.

Figure 5:
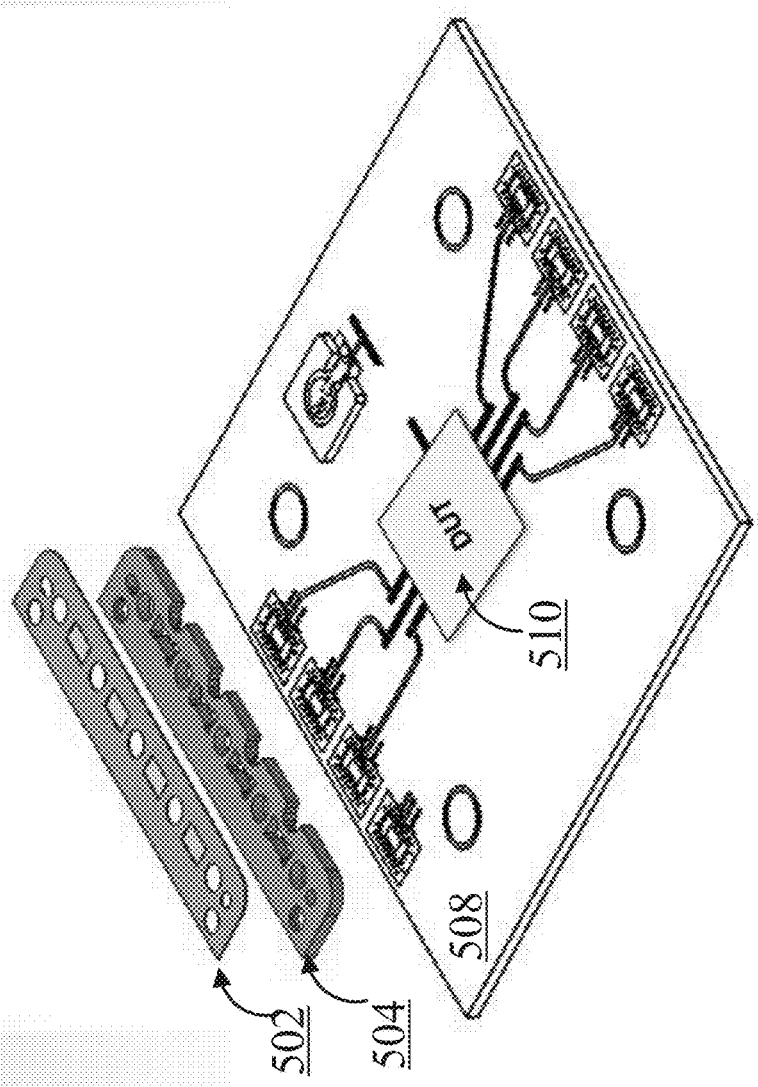
FIG. 5 is an exemplary perspective view of the manner in which an air barrier and tuning plate is integrated into the ganged waveguide assembly in accordance with embodiments of the present disclosure.

FIG. 5 is an exemplary perspective view of the manner in which an air barrier 502 and tuning plate 504 is integrated into the ganged waveguide assembly in accordance with embodiments of the present disclosure.

In order for the ganged waveguide to operate at high temperatures, a temperature isolation transition adapter 115 (as shown in FIG. 1A) is employed at one end of the ganged waveguide structure and an air barrier element 502 is disposed at the other end (as shown in FIG. 5). These elements help to reduce the transfer of heat (which builds up in the metal waveguide structures) to the tester. This thermal isolation is particularly important for high temperature environments, e.g., for automobile applications that require a high temperature range of operation.

More specifically, air barrier element 502 is a transparent window that helps block the hot air flowing through the waveguide assembly. When the waveguide is docked onto the daughter card 508, there is a significant amount of pressure and heat propagating through the waveguide assembly. The air barrier 502 stops the pressure and airflow from being transmitted straight down to the instrumentation. In one embodiment, the window may be constructed from a low dielectric constant material. The window is transparent to the microwave signals, however, so the signal propagating through the waveguide assembly passes through the air barrier 502.

The tuning plate 504 comprises double ridge slots that tune the signal so that most of the energy from the signal gets transmitted to the patch antennas on the daughter card. In one embodiment, the daughter card 508 can include one or more patch antennas capable of propagating signals at varying gain levels. As such, a set of different patch antennas (e.g., patch antenna 609 in FIG. 6) can be adapted to electrically couple to microstrip transmission lines formed on the daughter card 508 to convey test signals received from a DUT 510 to a tester diagnostic system or a different location point. Furthermore, the patch antennas may be used to generate differential signals to amplify test signals transmitted from a DUT 510. Differential signals can then be converted into a single ended output signal using a transformer device.

In an embodiment, a machining process is used to create the tuning plate. In one embodiment, a tuning plate is unique to a given daughter card. If the daughter card is swapped out, a different tuning plate would need to be used. In an embodiment, the openings in the tuning plate are configured to be aligned with a plurality of patch antennas on the daughter card 508, and where a pitch of the openings is operable to align with a pitch of the patch antennas (e.g., patch antenna 609 in FIG. 6).

FIG. 6 is an exemplary perspective view of the tuning plate in connection with a printed circuit board (PCB) in accordance with embodiments of the present disclosure.

As shown in FIG. 6, the double ridge slots (which are shaped like I's) 604 in tuning plate 602 can be configured with specific dimensions so that the waveguide signal can be transferred to the patch antenna 609 without any significant loss. In other words, the tuning plate improves energy coupling with the daughter card 610. The shape and size (in both the X and Y directions) of the double ridge slots 604 can be configured for maximal energetic coupling. In other words, changing the X and Y dimensions of the double ridge slots 604 can change the performance of the signal transmission. As noted above, the tuning plate 602 is specific to a daughter card (or load board). Different types of load boards and different types of frequencies (being communicated via the patch antennas) require different types of tuning plates and tuning requirements.

Figure 7:
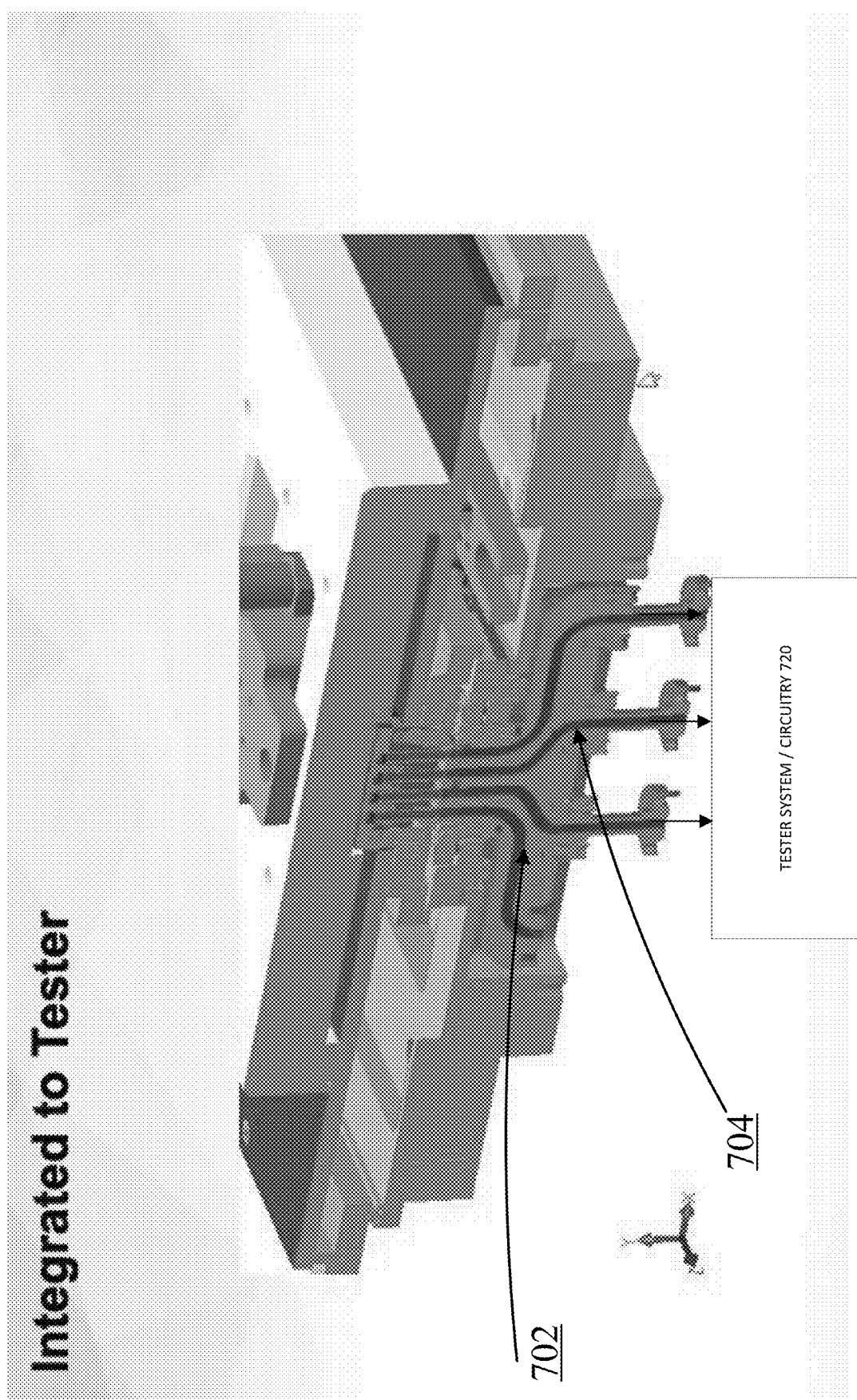
FIG. 7 is an exemplary cross-sectional view of the manner in which the ganged waveguide assembly is integrated with the tester in accordance with embodiments of the present disclosure.

FIG. 7 is an exemplary cross-sectional view of the manner in which the ganged waveguide assembly is integrated with the tester 720 in accordance with embodiments of the present disclosure. For instance, with reference to the embodiment depicted in FIG. 7, the ganged waveguide may be fabricated in a manner such that the end of the transition adapter 115 (as shown in FIG. 1A) connected to the tester system/tester circuitry 720 is configured to expand or "fan out" in a direction that is away from the location of the high density, tightly packed array of patch antennas (for examples, the patch antennas shown in FIG. 6). As shown in FIG. 7, channels 702 and 704 fan out to carry the signal from the transition adapter 115 to the tester 720.

Embodiments of the present invention advantageously provide improvements in cost, size, mechanical stability, space and improved millimeter performance (observed as lower and better return loss). Further, embodiments of the present invention bring the high density waveguide solution to many applications where it was not previously possible and provide improvements over the current solutions primarily in mechanical areas that contributed to poor manufacturing yields and higher costs.

Figure 8:
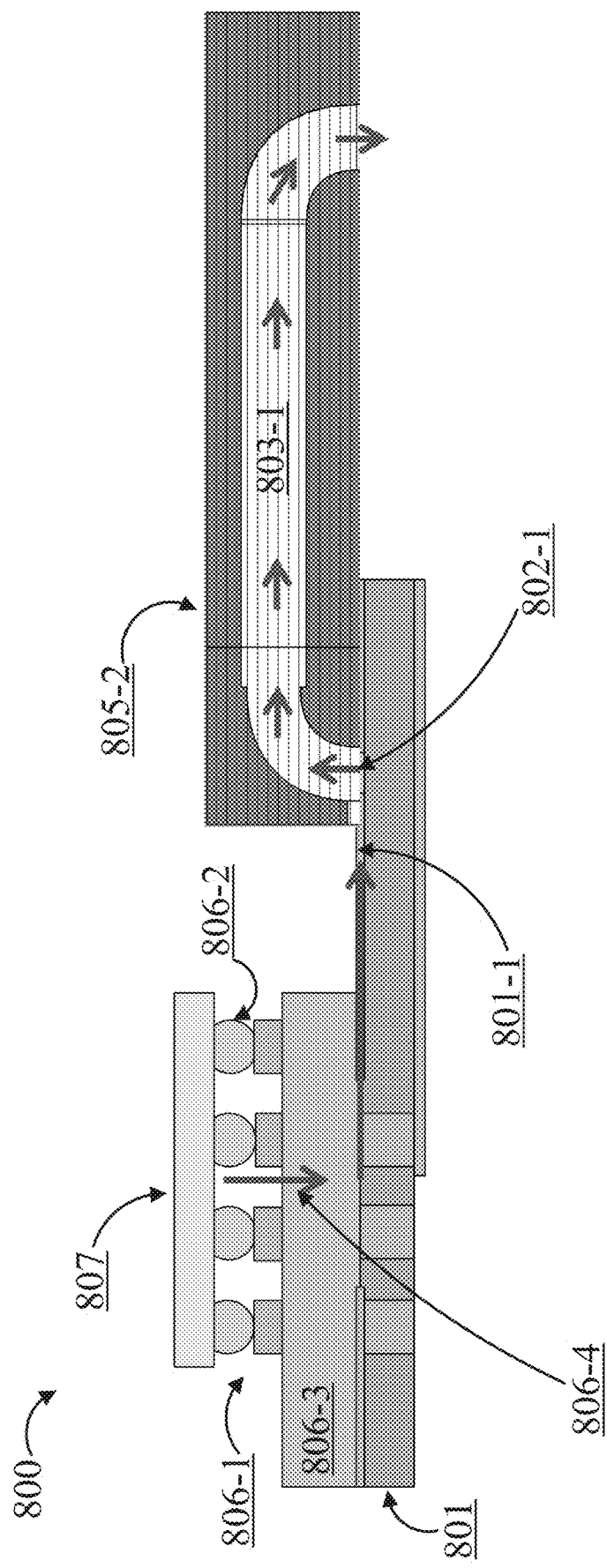
FIG. 8 depicts an exemplary signal path through an exemplary wave interface assembly in accordance with embodiments of the present disclosure.

FIG. 8 depicts an exemplary signal path through an exemplary wave interface assembly in accordance with embodiments of the present disclosure. With reference to the embodiment depicted in FIG. 8, during a testing session using wave interface assembly 800, a device under test (e.g., DUT 807) may be loaded within a socket (e.g., socket 806-1) of a DUT interface that includes a BGA layer, such as BGA layer 806-2. As depicted in FIG. 8, in some embodiments, wave interface assembly 800 may include a contactor layer, such has contactor layer 806-3.

Thus, when DUT 807 is loaded within socket 806-1 during the testing session, the DUT 807 can make contact with BGA layer 806-2 thereby generating test signals 806-4. A microstrip transmission line, such as microstrip transmission line 801-1, may be longitudinally formed along a top surface of PCB 801 (e.g. daughter card 610). As depicted in FIG. 8, a patch antenna, such as patch antenna 802-1, can serve as a location where a waveguide channel of the ganged waveguide (e.g., waveguide channel 803-1) is mounted onto a patch antenna (e.g., patch antenna 802-1) positioned flushed against the top surface of PCB 801 and electrically coupled to microstrip transmission line 801-1. Note that, as explained above, an air barrier 502 and a tuning plate 504 may also be sandwiched between the ganged waveguide and the PCB.

In this fashion, a mating interface located at one end of wave guide 803-1 can be mounted on to a top surface of PCB 801 at a location that is perpendicular to the location of patch antenna 802-1. As depicted by the embodiment in FIG. 8, patch antenna 802-1 can direct the propagation of test signals 806-4 received into and through an opening located at one end of waveguide channel 803-1. As such, patch antenna 802-1 can be configured to match impedance levels between waveguide channel 803-1 and microstrip transmission line 801-1 during the transmission of test signals 806-4 through wave interface assembly 800.

FIG. 9 is a flowchart of an exemplary method of composing a ganged waveguide structure in accordance with embodiments of the present disclosure. The disclosure, however, is not limited to the description provided by flowchart 900. Rather, it will be apparent to persons skilled in the relevant art(s) from the teachings provided herein that other functional flows are within the scope and spirit of the present disclosure. Flowchart 900 will be described with continued reference to exemplary embodiments described above, though the method is not limited to those embodiments.

At step 902, a metallic waveguide component is milled from a single metal piece. An incision is created and the metallic component is cut into two pieces thereby dividing the waveguide structure into two metal plates.

At step 904, trenches are carved into the inner surfaces of the two metal plates.

At step 906, the metal plates are bolted together to create channels for signal transmission within the waveguide component.

At step 908, the waveguide component is connected to a PCB on one end (e.g., daughter card 508 as shown in FIG. 5) and to a transition adapter 115 (as shown in FIG. 1A) on the other end. Signals are transmitted between a DUT (e.g., DUT 510 in FIG. 5) on the daughter card 508 and a tester system connected to the transition adapter, wherein the transition adapter insulates the tester system from the higher temperatures reached by the waveguide component.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

It should also be understood, of course, that the foregoing relates to exemplary embodiments of the invention and that modifications may be made without departing from the spirit and scope of the invention as set forth in the following claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. An integrated structure for signal transmission, said integrated structure comprising:
    a ganged waveguide component operable to transmit a signal, the ganged waveguide component comprising a top metal plate and a bottom metal plate, wherein the top metal plate and the bottom metal plate comprise recesses, wherein the top metal plate and the bottom metal plate are affixed together to create waveguide channels in alignment with the recesses; and
    a waveguide adapter affixed to a first end of the bottom plate of the ganged waveguide component and operable to conduct the signal to a tester, wherein the waveguide adapter is operable to thermally isolate the ganged waveguide component.

2. The integrated structure of claim 1, further comprising:
    an air barrier affixed to a second end of the bottom metal plate of the ganged waveguide component operable to prevent air from flowing from a printed circuit board operable to be connected at the second end of the ganged waveguide component to the ganged waveguide component.

3. The integrated structure of claim 2, further comprising:
    a tuning plate coupled to the air barrier and comprising double ridge slots configured to allow tuned signal strength to be transferred to the printed circuit board from the ganged waveguide component.

4. The integrated structure of claim 3, wherein the tuning plate is created using a machining process, and wherein the tuning plate is configured custom for the printed circuit board.

5. The integrated structure of claim 1, wherein the ganged waveguide component is composed of a metal selected from a group including brass, aluminum, and copper.

6. The integrated structure of claim 1, wherein the waveguide channels comprise U-shaped channels, wherein signals are operable to be passed into, and transmitted out of, the waveguide component from a same side of the waveguide component.

7. The integrated structure of claim 1, wherein the waveguide channels comprise Z-shaped channels, wherein signals are operable to be passed into, and transmitted out of, the waveguide component from opposite sides of the waveguide component.

8. The integrated structure of claim 1, wherein the waveguide channels comprise L-shaped channels.

9. The integrated structure of claim 1, wherein the waveguide adapter affixed to the bottom plate of the first end of the ganged waveguide component is operable to conduct the signal to the tester using gold-plated channels.

10. A tester system comprising:
a ganged waveguide component comprising a top metal plate and a bottom metal plate, wherein the top metal plate and the bottom metal plate comprise recesses, wherein the top metal plate and the bottom metal plate are affixed together to create waveguide channels that aligns with the recesses;
a waveguide adapter affixed to a first end of the bottom plate of the ganged waveguide component and operable to conduct a test signal to a tester, wherein the waveguide adapter is operable to thermally isolate the ganged waveguide component;
testing circuitry operable to generate the test signal and communicatively coupled to the waveguide adapter;
a printed circuit board communicatively coupled to a second end of the bottom metal plate of the ganged waveguide component; and
a device under test (DUT) disposed on the printed circuit board, wherein the DUT is operable to receive the test signal from the testing circuitry.

11. The tester system of claim 10, further comprising:
an air barrier affixed between the second end of the bottom metal plate of the ganged waveguide component and the printed circuit board and operable to restrict air from flowing through the ganged waveguide component.

12. The tester system of claim 11, further comprising:
a tuning plate affixed between the second end of the bottom metal plate of the ganged waveguide component and the printed circuit board and comprising double ridge slots configured to allow maximal signal to be transferred to the printed circuit board from the ganged waveguide component.

13. The tester system of claim 12, wherein the tuning plate is created using a machining process, and wherein the tuning plate is configured custom for the printed circuit board.

14. The tester system of claim 11, wherein the waveguide channels comprise U-shaped channels, wherein signals are operable to be passed into, and transmitted out of, the waveguide component from a same side of the waveguide component.

15. The tester system of claim 10, wherein the ganged waveguide component is composed of a metal selected from a group including brass, aluminum, and copper.

16. The tester system of claim 10, wherein the waveguide channels comprise Z-shaped channels, wherein signals are operable to be passed into, and transmitted out of, the waveguide component from opposite sides of the waveguide component.

17. The tester system of claim 10, wherein the waveguide channels comprise L-shaped channels.

18. The tester system of claim 10, wherein the waveguide adapter affixed to the first end of the ganged waveguide component is operable to conduct the signal to the tester using gold-plated channels.

* * * * *